United States Patent [19]

Neth

[11] Patent Number: 4,701,958
[45] Date of Patent: Oct. 20, 1987

[54] CONTROL CIRCUIT

[76] Inventor: Harald Neth, Elisenstrasse 33, A 1235 Vienna, Austria

[21] Appl. No.: 730,488

[22] Filed: May 6, 1985

[30] Foreign Application Priority Data

May 24, 1984 [AT] Austria .................................. 1722/84

[51] Int. Cl.⁴ ...................... H04R 25/00; H04R 25/04
[52] U.S. Cl. .................................... 381/68; 381/68.4; 381/69
[58] Field of Search ................ 381/68, 120, 121, 68.1, 381/68.2, 68.4, 68.6, 69; 179/107 R, 107 E, 107 FD; 323/255, 259; 330/279

[56] References Cited

U.S. PATENT DOCUMENTS

| | | | |
|---|---|---|---|
| 3,015,704 | 1/1962 | Behymer | 381/68.4 |
| 3,106,609 | 10/1963 | Dusey | 381/120 |
| 3,405,348 | 10/1968 | Biega et al. | 323/255 |
| 3,571,529 | 3/1971 | Gharib et al. | 381/68 |
| 4,130,725 | 12/1978 | Nagel | 381/120 |
| 4,201,886 | 5/1980 | Nagel | 381/120 |
| 4,360,787 | 11/1982 | Galpin | 330/279 |

Primary Examiner—Gene Z. Rubinson
Assistant Examiner—Danita R. Byrd
Attorney, Agent, or Firm—Kurt Kelman

[57] ABSTRACT

An automatic gain control circuit for an output signal of a magnetic earpiece of a hearing aid, which comprises a voltage source, an output amplifier stage having an input connected to the voltage source and an output connected to the magnetic earpiece, the earpiece having a working winding connected between the amplifier stage output and the voltage source, and a control loop for automatic gain control. The control loop includes a rectifier and an additional winding connected in series with the working winding of the earpiece, the windings constituting an autotransformer, the additional winding connecting the rectifier to the output of the amplifier stage and the rectifier being connected to the input of the amplifier stage.

5 Claims, 2 Drawing Figures

CONTROL CIRCUIT

BACKGROUND OF THE INVENTION (1) Field of the Invention

The invention relates to a control circuit for an amplifier with an output-controlled automatic gain control for a hearing aid, comprising an output amplifier stage, a magnetic earpiece which has a working winding connected between the output of the output amplifier stage and the operating voltage, and a control loop having a recitifier, for automatic gain control, which control loop is connected between the output of the output amplifier stage and the input of the output amplifier stage or a preamplifier stage if provided.

Hearing difficulties (deafness) may be roughly divided into two different groups, more specifically what is known as sound conduction deafness (middle ear deafness) and what is referred to as acoustic perception deafness (inner ear deafness). However, while in the case of sound conduction deafness, both the threshold of audibility and also the pain threshold are generally shifted upwardly by about the same amount and therefore it is possible to achieve good correction with greater or lesser amplification of the sound signal supplied, acoustic perception deafness often only involves upward displacement of the threshold of audibility, while the pain threshold is at the same level or even at lower values than in the case of a healthy ear.

(2) Description of the Prior Art

In order to take account of the dynamic range of the acoustic signals which occurs in practice, dynamic compression is always provided in hearing aids for inner ear deafness. A number of circuits have been developed for that purpose. One of those circuits which has proved successful in practice is automatic gain control.

In that circuit, a part of the output voltage is taken off at the output of the output amplifier of the hearing aid, that is to say, at the earpiece itself, rectified and filtered. The control voltage which is obtained in that way is generally fed to a preamplifier stage where it provides for gain control which is inversely proportional to the magnitude of the control voltage. This is effected, for example, by displacing the working point of the controlled stage or by a variable controlled negative feedback. The circuit operates like a dynamic limiter, that is to say, when high amplitudes occur at the output, the control means comes into operation and suitably reduces the gain of the input stage.

A serious disadvantage of that known circuit is that the signal ac voltage which occurs at the earpiece is generally only about 300-500 mV under the conditions obtaining in the hearing aid. The level of efficiency of rectification is therefore low and the reduction in gain when the control means comes into operation remains within restricted limits. It has also been proposed that, instead of a single diode, use may be made of full-wave rectification or voltage doubling in order to obtain a stronger control signal. However, it is then often no longer possible for the components which are additionally required for that purpose to be disposed in a hearing aid without increasing its size. The attempt to replace normal silicon diodes by Schottky diodes is also unsuccessful as both behave in a very similar fashion with the small currents which occur in this context. Finally, the use of germanium diodes which have a noticeably lower forward voltage encounters serious difficulties as those diodes are not produced in miniaturised form and are therefore generally unsuitable for use in a hearing aid.

SUMMARY OF THE INVENTION

It is an object of the present invention to improve the level of efficiency in a control circuit of the kind set forth in the opening paragraph of this specification. According to the invention, this is achieved by connecting an additional winding in series with the working winding of the magnetic earpiece, to provide an autotransformer, and connecting the rectifier of the control loop through the additional winding to the output of the output amplifier stage.

This arrangement provides at the output of the additional winding and therefore at the output of the rectifier of the control loop, a higher signal ac voltage which, with the same number of turns in the working and additional windings, is double the voltage at the output of the output amplifier stage. The higher voltage gives a substantially improved level of efficiency in rectification so that it is possible to achieve effective control even with simple rectifier circuits. In some circuits, it was possible to measure a reduction in the maximum output acoustic pressure of more than 6 dB compared to the known circuit.

As all earpieces used nowadays for hearing aids operate in accordance with a known magnetic principle and therefore include a winding with a more or less closed iron circuit, the additional expenditure only extends to double the number of turns in the coil and a tapping on the winding. The earpiece is thus similar to one of the known types with center tapping for push-pull operation. There is no need for additional components so that the improvement in the control action may be attained without increasing the amount of space required.

Although the arrangement according to the invention is particularly suitable for very small hearing aids such as behind-the-ear hearing aids, hearing-aid spectacles and in-the-ear hearing aids, it can also be used in pocket hearing aids. A three-pole plug connection for the earpiece cable is already known from IEC 90, which may be used. Although that plug connection is non-polarised, the circuit will operate in the desired manner provided that the center pin of the plug is connected to the collector of the output transistor and both windings of the earpiece have the same number of turns.

BRIEF DESCRIPTION OF THE DRAWINGS

The invention will now be described in greater detail with reference to the drawing in which.

DESCRIPTION OF THE PREFERRED EMBODIMENTS

Figure 1:
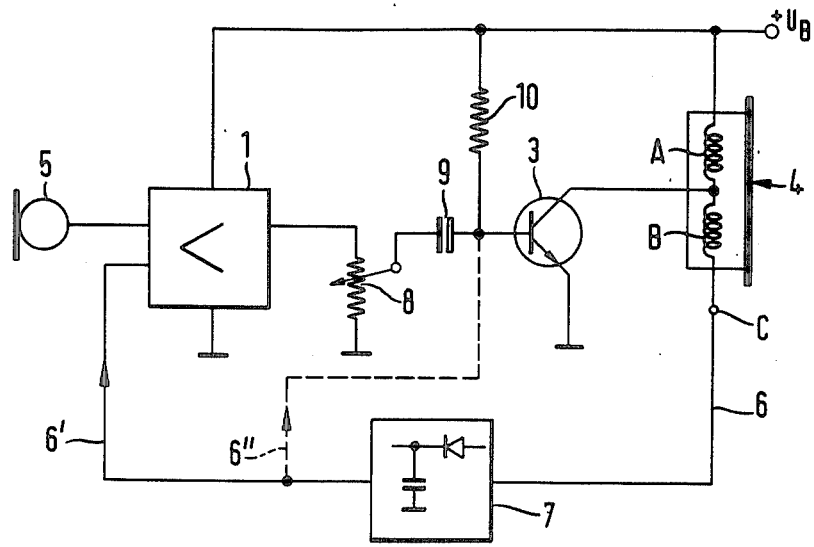
FIG. 1 shows an embodiment of a control circuit according to the invention, in a hearing aid circuit.

In the hearing aid circuit shown in FIG. 1, a microphone 5 is connected to the input of a preamplifier stage 1 whose output is coupled by way of a volume control 8 and a capacitor 9 for direct current separation to the input (base) of an output stage which is in the form of a npn-transistor 3. The base of the transistor is connected by way of a base resistor 10 to the operating voltage $+U_B$. The output (collector) of the transistor 3 is connected to the voltage source $+U_B$ by way of a working winding A. The working winding A is part of the magnetic system of the earpiece 4. Connected between the output (collector) of the transistor 3 and the control input of the preamplifier 1 is a control loop 6 which includes an additional winding B and a signal rectifier circuit 7. The windings A and B are connected in series in the form of an autotransformer. The signal rectifier circuit 7 comprises a rectifier which is connected in series with the winding B, and a capacitor which is disposed in parallel with the rectifier and connected to earth.

The control dc voltage 6' obtained in that way is fed to the preamplifier stage 1 where it causes a change in gain in known fashion which is not shown in the drawing. In another embodiment, the control voltage 6" may also be fed to the input of the output stage itself.

The level of efficiency of the signal rectifier circuit 7 is substantially improved in a simple manner by the circuit shown in FIG. 1 as the signal ac voltage obtained at the connection C of the earpiece 4 is substantially higher (being double with the same number of turns in the windings A and B,) than that at the output (collector) of the output stage transistor 3.

Figure 2:
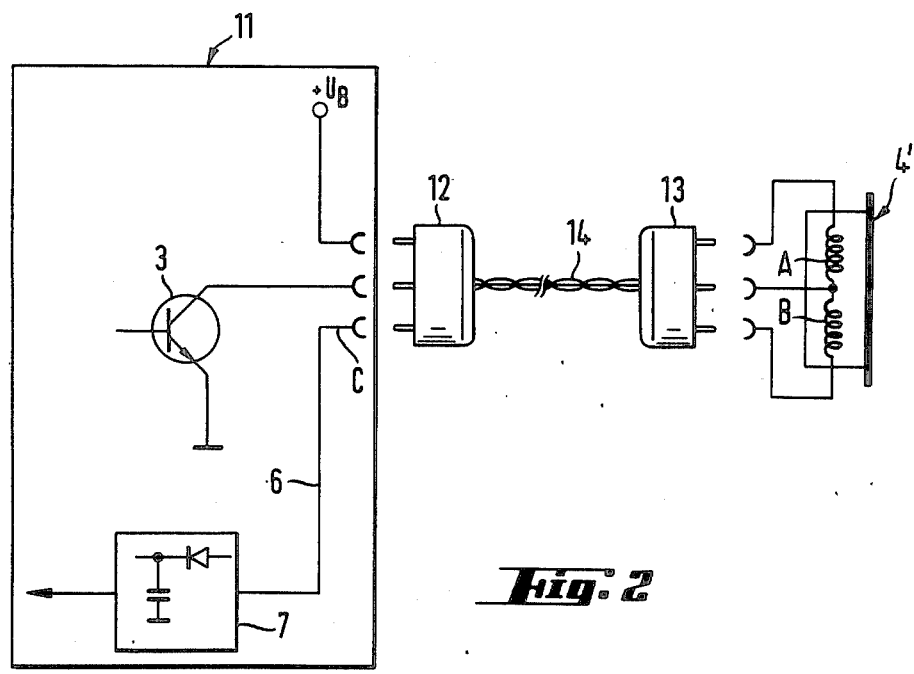
FIG. 2 shows the use of the control circuit shown in FIG. 1, in a pocket-type hearing aid.

As can be seen from FIG. 2, the invention can be used in pocket-type hearing aids in which the earpiece 4' is connected to the pocket hearing aid 11 by a connecting wire 14 with two three-pole plugs 12 and 13. The pocket hearing aid 11 which is shown in diagrammatic form has three output terminals which are associated with the plug 12 and which are connected to the operating voltage $+U_B$, the collector of the transistor 3 and the point C of the control loop 6. In the same manner, the earpiece 4' has three terminals which are associated with the input of the winding A, the junction between the two windings A and B, and the output of the additional winding B.

What is claimed is:

1. An automatic gain control circuit for an output signal of a magnetic earpiece of a hearing aid, which comprises
   (a) a voltage source,
   (b) an output amplifier stage having an input connected to the voltage source and an output connected to the magnetic earpiece,
      (1) the earpiece having a working winding connected between the amplifier stage output and the voltage source, and
   (c) a control loop for automatic gain control, the control loop including
      (1) a rectifier and
      (2) an additional winding connected in series with the working winding of the earpiece, the windings constituting an autotransformer, the additional winding connecting the rectifier to the output of the amplifier stage and the rectifier being connected to the input of the amplifier stage.

2. The automatic gain control circuit of claim 1, further comprising a preamplifier stage having an input and an output, the rectifier being connected to the input of the preamplifier stage and the output of the preamplifier stage being connected to the input of the output amplifier stage.

3. The automatic gain control circuit of claim 1, wherein the earpiece has a center tap between the working and additional windings.

4. The automatic gain control circuit of claim 3, wherein the earpiece is built into a hearing aid to be worn on the head.

5. The automatic gain control circuit of claim 3, wherein the earpiece is a plug-in earpiece, and further comprising a pocket hearing aid component, and a connecting cable between the earpiece and the pocket hearing aid component, the connecting cable having a three-pole plug with a center pin at each end thereof, the center pin of the plug at one end of the cable being connected to the center tap of the earpiece and the center pin of the plug at the other end of the cable being connected to the output of the output stage amplifier.

* * * * *